(12) United States Patent
Tang

(10) Patent No.: US 7,423,880 B1
(45) Date of Patent: Sep. 9, 2008

(54) SECURE DEVICE CAPABLE OF ENGAGING WITH A HEAT SINK FIRMLY

(75) Inventor: Yan-Jiun Tang, Kaohsiung (TW)

(73) Assignee: Asia Vital Components Co., Ltd., Kaohsiung (TW)

( * ) Notice: Subject to any disclaimer, the term of this patent is extended or adjusted under 35 U.S.C. 154(b) by 0 days.

(21) Appl. No.: 11/757,386

(22) Filed: Jun. 3, 2007

(51) Int. Cl.
*H05K 7/20* (2006.01)
*F28D 15/00* (2006.01)

(52) U.S. Cl. .................... 361/709; 361/704; 361/710; 165/104.33; 165/185; 248/510

(58) Field of Classification Search ............. 361/704, 361/709–710; 165/104.33, 185; 174/16.3; 248/510
See application file for complete search history.

(56) References Cited

U.S. PATENT DOCUMENTS

| | | | |
|---|---|---|---|
| 6,712,127 B2* | 3/2004 | Lee | 165/80.3 |
| 6,782,941 B2* | 8/2004 | Lee | 165/80.3 |
| D561,121 S * | 2/2008 | Mochizuki et al. | D13/179 |
| 2006/0054369 A1* | 3/2006 | Pan | 180/68.4 |
| 2008/0030952 A1* | 2/2008 | Chen et al. | 361/697 |

FOREIGN PATENT DOCUMENTS

DE  202007007222 U1 * 10/2007

* cited by examiner

*Primary Examiner*—Jayprakash N Gandhi
*Assistant Examiner*—Robert J Hoffberg

(57) ABSTRACT

A secure device for a heat sink includes a frame and a plurality of cylindrical posts. The frame provides a plurality of elongated projections at the inner side thereof. Each of the cylindrical posts is attached to the outer side of the frame. A plurality of split portions are provided at the upper end of the respective cylindrical post. A reversed deep countersink is provided in the cylindrical post and an engaging piece is disposed at the inner side of the respective split portion. A wedge locator is disposed at one of the split portions corresponding to a lateral side of the heat sink such that the heat sink is capable of being elastically secured with the wedge locator and the elongated projections.

3 Claims, 4 Drawing Sheets

FIG 1 (Prior Art)
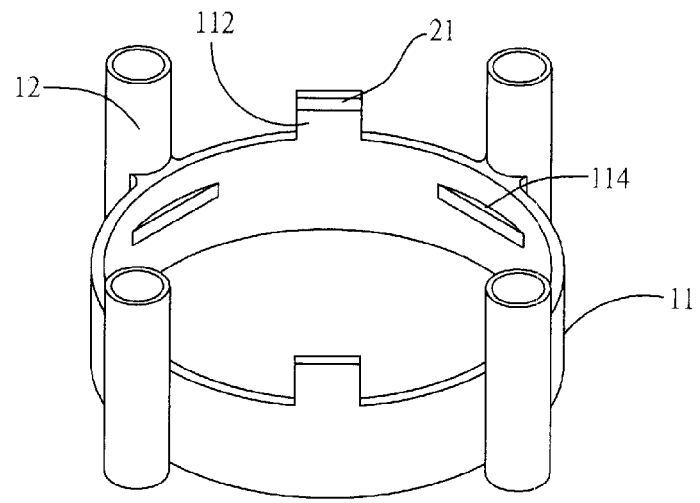
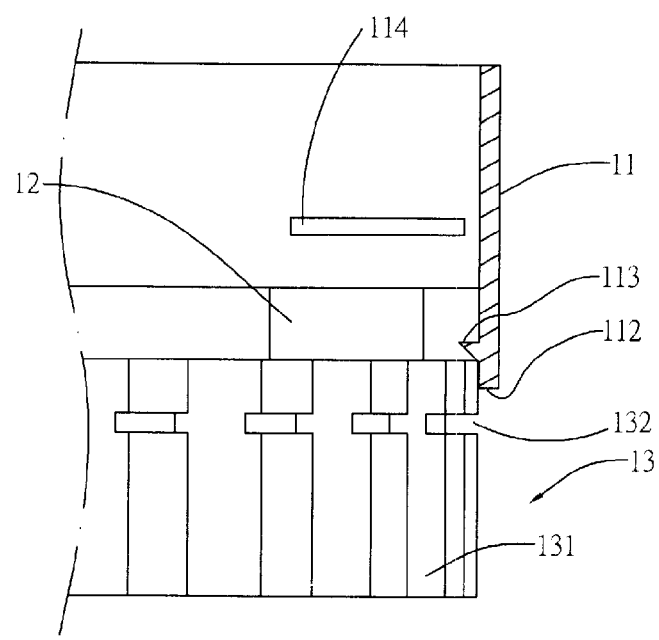
FIG 2 (Prior Art)

FIG 3 (Prior Art)
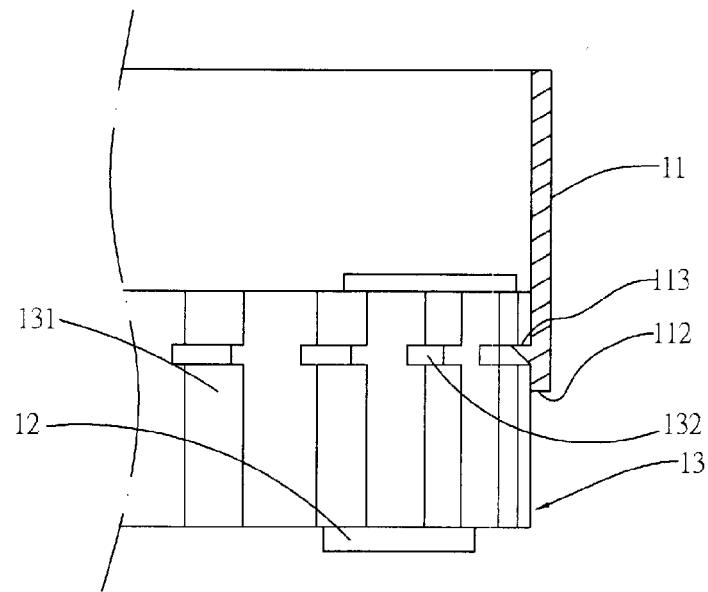
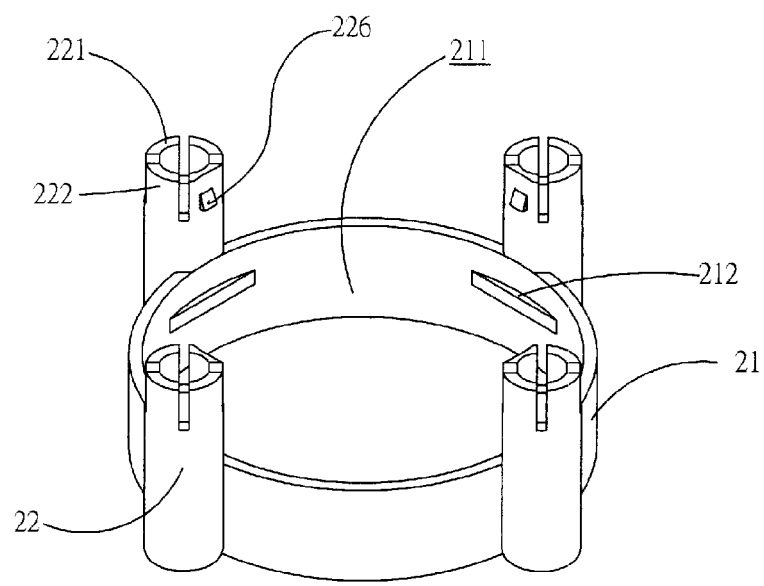
FIG 4

FIG 6
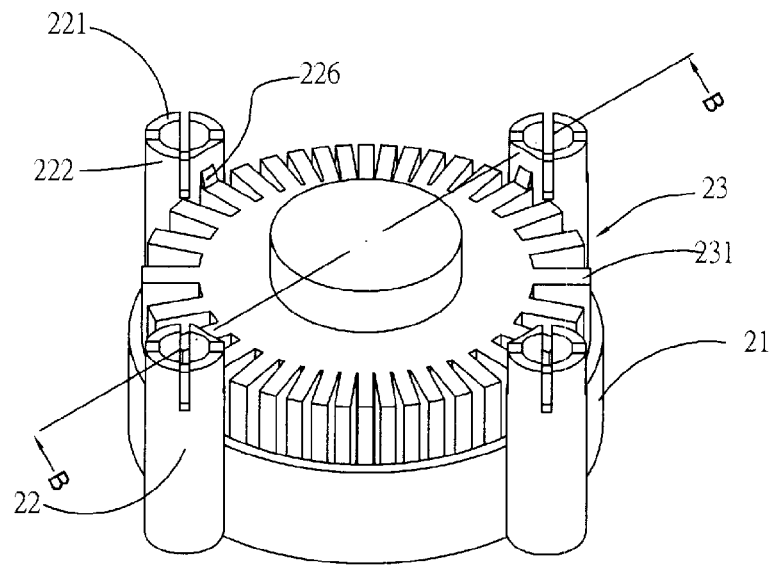
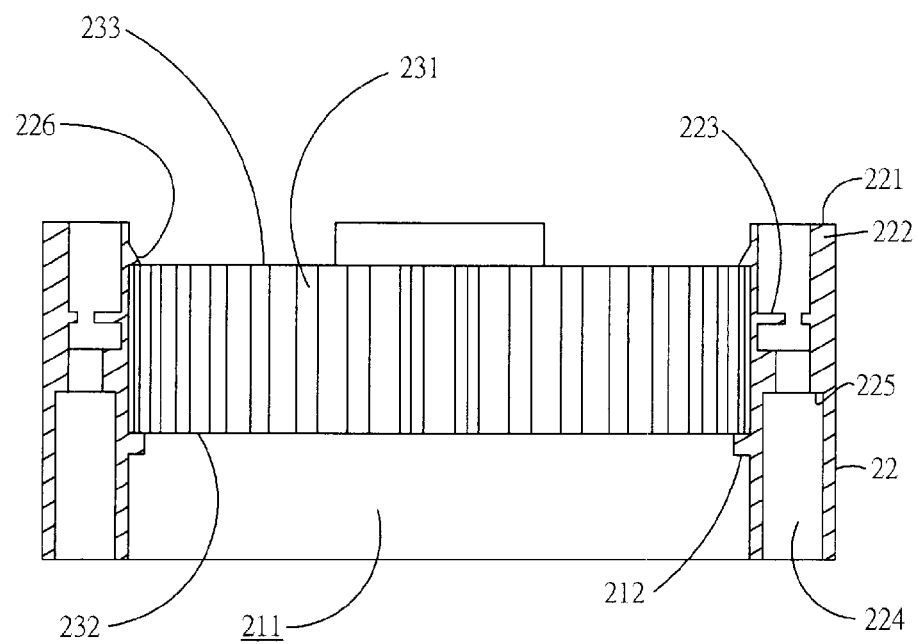
FIG 7

SECURE DEVICE CAPABLE OF ENGAGING WITH A HEAT SINK FIRMLY

BACKGROUND OF THE INVENTION

1. Field of the Invention

The present invention is related to a secure device and particularly to a secure device capable of engaging with a heat sink firmly.

2. Brief Description of the Related Art

The conventional secure device capable of engaging with a heat sink as shown in FIG. 1 provides a frame member 11 and a plurality of cylindrical posts 12 are vertically attached to the frame member 11. Each of the cylindrical posts 12 extends upward an end 112 and a plurality of holding projection parts 112 extend from the frame member 11 adjacent the cylindrical posts 12. The holding projection parts 112 are disposed in a way of being opposite to each others I in pairs. Each of the holding projection parts 112 has a hook end 113. A plurality of elongated support projections 114 are disposed at the inner side of the frame member 11.

A heat sink 13 provides a plurality of cooling fins 131 with a groove 132 disposed at each of the heat sink 13 corresponding to the hook end 113. When the heat sink 13 is received in the frame member 11 and supported by the support projections 114, the hook end 113 engages with the groove 132 such that the heat sink 13 is engaged to the frame member 11 smoothly.

However, the preceding cooling fins 131 have to be arranged the groove 132 to decrease the cooling area thereof respectively and the groove 132 increases fabrication work and cost of the heat sink 13. Further, the heat sink 13 is secured to the preceding secure device mostly depends on the holding projection parts 112 engaging with the groove 132 respectively at the upper portion of the heat sink 13 such that the frame member 11 is incapable of attached to the heat sink 13 integrally and it results in the hook ends 113 of the holding projection parts 112 escaping from the groove 132 easily.

SUMMARY OF THE INVENTION

In order to overcome the preceding problems, an object of the present invention is to provide a secure device engaging with the heat sink firmly, which provides a wedge locator at the respective cylindrical post to locate a lateral side of the heat sink precisely, such that the entire heat sink can be secured firmly.

another object of the present invention is to provide a secure device capable of engaging a heat sink firmly, which provides a plurality of split portions at the upper end of the respective cylindrical post, such that the heat sink can be held elastically to enhance the secure device being set up or detached conveniently.

Accordingly, A secure device engaging with a heat sink firmly according to the present invention includes a frame and a plurality of cylindrical posts. The frame provides a plurality of elongated projections at the inner side thereof. Each of the cylindrical posts is attached to the outer side of the frame. A plurality of split portions are provided at the upper end of the respective cylindrical post. A reversed deep countersink is provided in the cylindrical post and an engaging piece is disposed at the inner side of the respective split portion. A wedge locator is disposed at one of the split portions corresponding to a lateral side of the heat sink such that the heat sink is capable of being elastically secured with the wedge locator and the elongated projections.

BRIEF DESCRIPTION OF THE DRAWINGS

The detail structure, the applied principle, the function and the effectiveness of the present invention can be more fully understood with reference to the following description and accompanying drawings, in which:

FIG. 1 is a perspective view of the conventional secure device for a heat sink;

FIG. 2 is a fragmentary sectional view illustrating the conventional secure device being detached from the heat sink;

FIG. 3 is a fragmentary sectional view similar to FIG. 2 illustrating the conventional secure device engaging with the heat sink;

FIG. 4 is a perspective view of a secure device engaging with a heat sink firmly according to the present invention;

FIG. 6 is a perspective view illustrating the secure device of the present invention engaging with the heat sink shown in FIG. 5; and FIG. 7 is a sectional view along line 6-6 shown in FIG. 6.

DETAILED DESCRIPTION OF THE INVENTION

Figure 5:
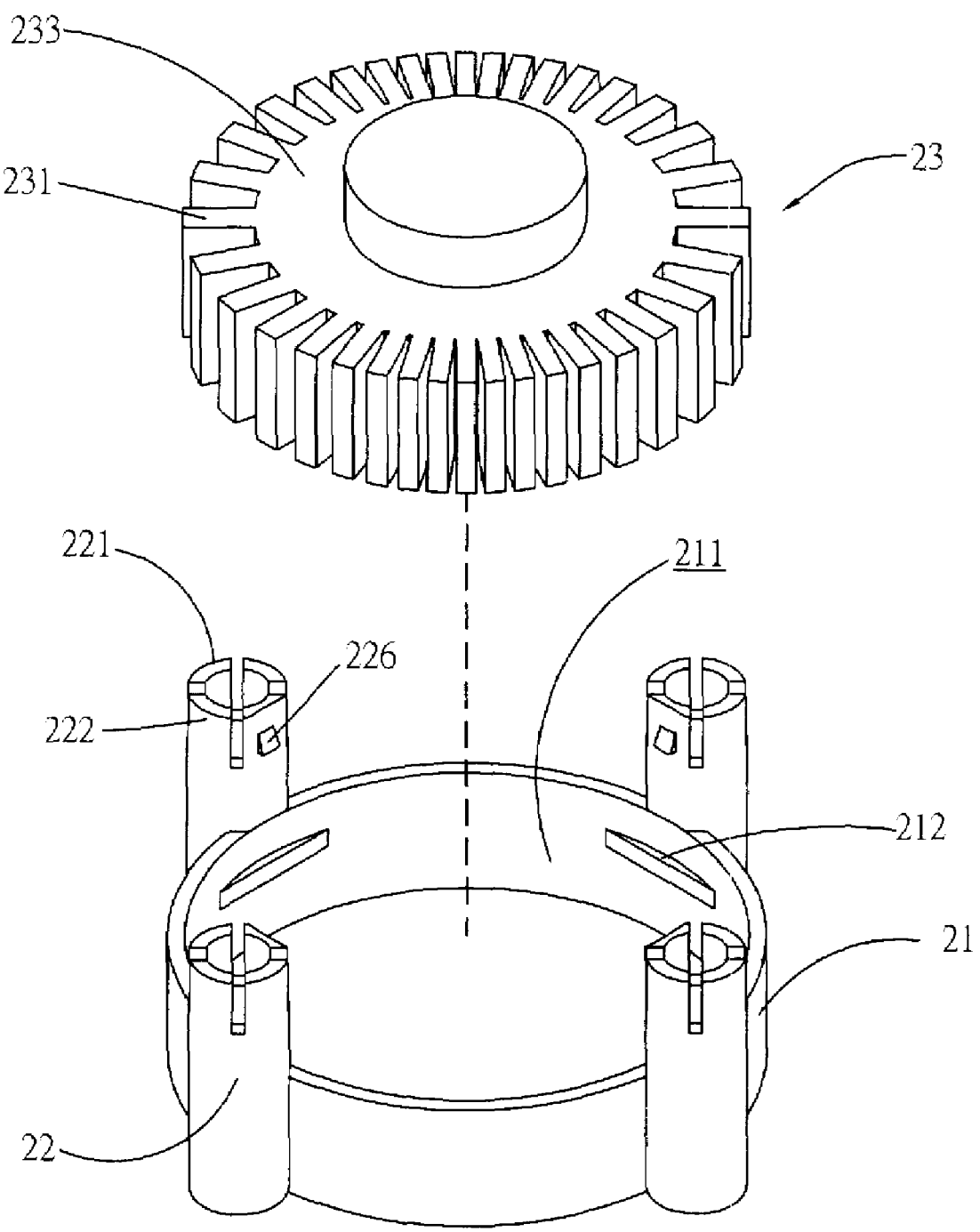
FIG. 5 is a perspective view illustrating a secure device of the present invention in a state of being detached from a heat sink.

Referring to FIGS. 4 and 7, a secure device engaging with a heat sink firmly according to the present invention provides an annular frame 21, which encloses a space 211, and at least a cylindrical post 22 is attached to the outer circumferential side of the annular frame 21. It is preferable that four cylindrical posts 22 are provided at the annular frame 21 equidistantly as shown in FIG. 4 or three cylindrical posts are arranged equidistantly. Each of the cylindrical posts 22 has an upper end 221 extending outward along a direction parallel to axial line (not shown) of the annular frame 21 and the upper end 221 has equidistant split portions 222. The respective cylindrical post 22 has an engaging piece 223 at the inner side of the split portions 222 respectively and a reversed deep countersink 224 with a step part 225 for a screw fastener (not shown) passing through the deep countersink 224 and elastically held by the split portions 222.

Each of the cylindrical posts 22 has a wedge locator 226 disposed at the split portion 222 next to the space 211. At least an elongated projection 212 is provided at the inner circumferential side of the annular frame 21. It is noted that the wedge locator 226 and the elongated projection 212 are arranged to correspond to the top side and the bottom side of a heat sink 23. The annular frame 21 is shaped according to the configuration of the heat sink 23. Alternatively, it can be a shape of square or other shapes corresponding to a square heat sink or a heat sink with other shapes. A plurality of ventilation holes (not shown) can be provided at the frame 21.

Referring to FIGS. 5 and 6 in company with FIG. 7 again, the heat sink 23 is made of metal with good heat conductivity such as aluminum or copper. A plurality of cooling fins 231 are disposed on the heat sink 23 to increase cooling area. Further, the heat sink 23 can be fabricated with extruded aluminum, casting or folding and a heat pipe can be arranged piercing the heat sink 23.

When the heat sink 23 is placed in the space 211 of the frame 21 from the upper ends of the cylindrical posts 22, the wedge locators 226 are elastically moved outward. Once the heat sink 23 occupies the space 211, a lateral side 232 of the heat sink 23 keeps contact with the elongated projections 212 and another lateral side 233 is held by the wedge locators 226. In this way, the secure device of the present invention is capable of engaging with the heat sink 23.

It is appreciated that the secure device of the present invention can secure the heat sink 23 with the wedge locators 226 and the elongated projections 212 elastically such that the deficiency of loosening of the prior art can be overcome effectively.

While the invention has been described with referencing to a preferred embodiment thereof, it is to be understood that modifications or variations may be easily made without departing from the spirit of this invention, which is defined by the appended claims.

What is claimed is:

1. A secure device capable of engaging with a heat sink firmly comprising:

a frame with an outer side, an inner side and a surrounded space providing at least an elongated projection at the inner side; and at least a cylindrical post being attached to the outer side of the frame;

characterized in that a plurality of split portions at an end thereof, a reversed deep countersink is provided in the cylindrical post, an engaging piece is disposed at the inner side of the respective split portion and a wedge locator is disposed at one of the split portions corresponding to a lateral side of the heat sink such that the heat sink is capable of being elastically secured with the wedge locator.

2. The secure device as defined in claim 1, wherein the wedge locator is next to the space.

3. The secure device as defined in claim 1, wherein the split portions are disposed equidistantly.

* * * * *